United States Patent
Yu et al.

(10) Patent No.: US 12,288,725 B2
(45) Date of Patent: Apr. 29, 2025

(54) CRITICAL DIMENSION ERROR ANALYSIS METHOD

(71) Applicant: SHANGHAI IC R&D CENTER CO., LTD., Shanghai (CN)

(72) Inventors: Xueru Yu, Shanghai (CN); Hongxia Sun, Shanghai (CN); Chen Li, Shanghai (CN); Pengfei Wang, Shanghai (CN); Jiebin Duan, Shanghai (CN); Xiucui Wang, Shanghai (CN); Hao Fu, Shanghai (CN); Tao Zhou, Shanghai (CN); Yan Yan, Shanghai (CN); Bowen Xu, Shanghai (SH); Lingyi Guo, Shanghai (CN); Liren Li, Shanghai (CN)

(73) Assignee: SHANGHAI IC R&D CENTER CO., LTD., Shanghai (CN)

(*) Notice: Subject to any disclaimer, the term of this patent is extended or adjusted under 35 U.S.C. 154(b) by 498 days.

(21) Appl. No.: 17/776,637

(22) PCT Filed: Jul. 23, 2020

(86) PCT No.: PCT/CN2020/103758
§ 371 (c)(1),
(2) Date: May 13, 2022

(87) PCT Pub. No.: WO2021/103602
PCT Pub. Date: Jun. 3, 2021

(65) Prior Publication Data
US 2022/0399237 A1   Dec. 15, 2022

(30) Foreign Application Priority Data
Nov. 29, 2019 (CN) .......................... 201911197188.2

(51) Int. Cl.
   H01L 21/66   (2006.01)

(52) U.S. Cl.
   CPC .............. *H01L 22/12* (2013.01); *H01L 22/26* (2013.01)

(58) Field of Classification Search
None
See application file for complete search history.

(56) References Cited

U.S. PATENT DOCUMENTS

2019/0354022 A1* 11/2019 Sha .......................... G03F 7/202

FOREIGN PATENT DOCUMENTS

| CN | 103777460 A1 | 5/2014 | |
|---|---|---|---|
| CN | 110245395 A1 | 9/2019 | |
| CN | 111146104 A * | 5/2020 | ............. H01L 22/12 |

* cited by examiner

*Primary Examiner* — Hsien Ming Lee
(74) *Attorney, Agent, or Firm* — Bayramoglu Law Offices LLC

(57) ABSTRACT

The present invention disclosures a critical dimension error analysis method, comprising: S01: performing lithography processes on a wafer, measuring the critical dimension (CD) values of the test points in each of the fields respectively; M and N are integers greater than 1; S02: removing extreme outliers from the critical dimension (CD) values; S03: rebuilding remaining CD values by a reconstruction model fitting method, and obtaining rebuilt critical dimension (CD") values, according to relative error between CD" and CD, dividing the rebuilt critical dimension (CD") values into scenes and the number of the scenes is A; S04: calculating components and corresponding residuals of the test points in each of the scenes under a reference system corresponding to a correction model by parameter estimation; S05: modifying machine parameters and masks by the correction model according to above calculation results. The present invention uses an outer limit to remove extreme outliers, so as to analyze a critical dimension error during a lithography process quickly and accurately.

10 Claims, 1 Drawing Sheet

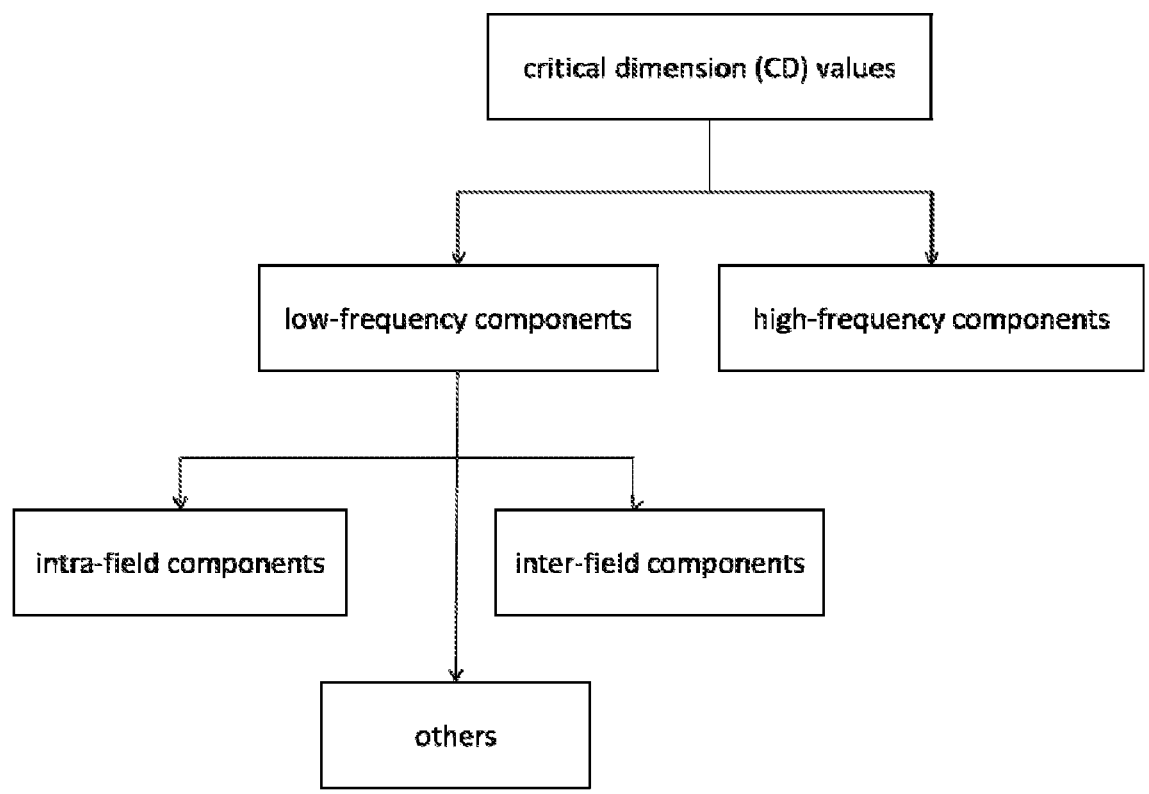

CRITICAL DIMENSION ERROR ANALYSIS METHOD

CROSS-REFERENCE TO RELATED APPLICATION

This application claims priority of International Patent Application Serial No. PCT/CN2020/103758, filed Jul. 23, 2020, which is related to and claims priority of Chinese Patent Application Serial No. CN201911197188.2, filed Nov. 29, 2019. The entirety of each of the above-mentioned patent applications is hereby incorporated herein by reference and made a part of this specification.

TECHNICAL FIELD

The disclosure relates to the technical field of semiconductor lithography, in particular to a critical dimension error analysis method.

BACKGROUND

In a lithography process, a critical dimension (CD) error of a device is coupled with other devices. In the prior art, the source of the CD error can be determined by measuring and decomposing a lithography result. A traditional error decomposition method is based on averaging and model fitting in different coordinate systems. However, the error decomposition method introduces too much human interference, such as a artificial coordinate system, a mean value instead of an expected value, model, etc.

An existing critical dimension error analysis method comprises calculating a variance through overall distribution first, and deleting abnormal CD values, for the distribution of the extreme outliers in each of fields is not the same, so values that are not the extreme outliers in the overall distribution are not necessarily the extreme outliers, thus the error analysis method does not fully utilize prior information in the prior art. In addition, in the prior art, estimating intra-field and inter-field errors in the fields by a averaging method is based on a model or a coordinate system, however, the accuracy of the model and the reliability of the coordinate system can directly affect test results, and introduce too many unnecessary assumptions, which make analysis results affected by the coordinate system and the model can not analyze the source of the CD error accurately and quickly.

SUMMARY

The purpose of the present invention is to provide a critical dimension error analysis method, which uses an outer limit to remove extreme outliers, which can analyze a critical dimension error during a lithography process quickly and accurately.

In order to achieve the above objective, the present invention adopts the following technical solution: a critical dimension error analysis method, comprising following steps: S01: performing lithography processes on a wafer, wherein the wafer comprises fields and the number of the fields is M, the lithography processes are the same in each of the fields, setting the same number of test points in each of the fields and the number of the test points is N, measuring the critical dimension (CD) values of the test points in each of the fields respectively; M and N are integers greater than 1; S02: removing extreme outliers from the critical dimension (CD) values; S03: rebuilding remaining CD values by a reconstruction model fitting method, and obtaining rebuilt critical dimension (CD") values, according to relative error between CD" and CD, dividing the rebuilt critical dimension (CD") values into scenes and the number of the scenes is A, and the the same test points in the fields are in the same scene, and the relative error between CD" and CD of any two fields in each of the scenes is non-periodic in spatial distribution; A is an integer greater than 0; S04: calculating components and corresponding residuals of the test points in each of the scenes under a reference system corresponding to a correction model by parameter estimation; S05: modifying machine parameters and masks by the correction model according to above calculation results.

Further, in step S02, removing the extreme outliers by the parameter estimation, which comprises following steps: S021: setting the critical dimension value ($CD_{i,j}$) of the j-th test point in the i-th field as $CD_{i,j}=inter_i+intra_j+Er_{i,j}$, wherein $inter_i$ is the inter-field component of the j-th test point, $intra_j$ is the intra-field component of the j-th test point, and $Er_{i,j}$ is error; treating $inter_i$ and $intra_j$ as dummy variables of a inter-field component set (inter) and a intra-field component set (intra) respectively, taking $inter_i$ and $intra_j$ as parameters without considering $Er_{i,j}$, and estimating parameters of CD to obtain the inter-field component ($inter0_i$) and the intra-field component ($intra0_j$) of the j-th test point, and after reconstruction, the rebuilt critical dimension value (CD') of the j-th test point equals $inter0_i$ plus $intra0_j$, which is $CD'=inter0_i+intra0_j$; S022: setting the relative error (Er_r') between CD' and CD as Er_r'=(CD'-CD)/CD', and calculating the outer limit of the relative error between CD' and CD; S023: removing extreme outliers which exceed the outer limit of the relative error between CD' and CD; S024: repeating from step S021 to S023 until the extreme outliers is removed, or ratio of number of remaining test points to number of original test points is less than a number threshold after removing, or number of iterations is greater than a iteration threshold.

Further, in step S023, a calculation method for the outer limit comprises sorting the the relative error between CD' and CD, and calculating a 25th quantile (Q1) and a 75th quantile (Q3), and setting IQR=Q3-Q1, the lower limit of the outer limit is Q1-3*IQR, and the upper limit of the outer limit is Q3+3*IQR.

Further, the approach to the parameter estimation is maximum likelihood estimation.

Further, The error analysis method according to claim 1, wherein step S03 comprises: S031: inputting the global coordinates of the wafer as independent variables into the reconstruction model, and inputting the remaining critical dimension values as dependent variables into the reconstruction model, and reconstructing the critical dimension values by adjusting reconstruction model parameters to obtain the rebuilt critical dimension (CD") values after reconstruction; S032: calculating the relative error (Er") between CD" and CD and Er"=(CD"-CD)/CD", and dividing the remaining critical dimension values into the scenes according to the relative error between CD" and CD, and the number of the scenes is A; S033: recording the reconstruction model parameters corresponding to each of the scenes.

Further, the reconstruction model is a GBDT model or an XGBoost model.

Further, in S03, determining whether the relative error between CD" and CD of any two fields in each of the scenes is periodic in the spatial distribution by a Pearson coefficient; while the Pearson coefficient of any two fields in one scene is less than the set threshold, then the relative error between CD" and CD of the two fields in the scene is non-periodic in the spatial distribution.

Further, in S04, the components and the corresponding residuals of the test points under the reference system corresponding to the correction model comprise a overall residual, intra-field X components, intra-field Y components, intra-field residuals, inter-field X components, inter-field Y components, and inter-field residuals of the test points.

Further, in S04 comprises: S041: setting the critical dimension value ($CD_{i,j}$") of the j-th test point in the i-th field as $CD_{i,j}"=inter_i"+intra_j"+res_{i,j}$, wherein, $inter_i"$ is the inter-field component of the j-th test point, $intra_j"$ is the intra-field component of the j-th test point, and $res_{i,j}$ is the overall residual; treating $inter_i"$ and $intra_j"$ as dummy variables of a inter-field component set (inter) and a intra-field component set (intra) respectively, taking $inter_i"$ and $intra_j"$ as parameters without considering $res_{i,j}$, and estimating parameters of CD" to obtain the inter-field component ($inter0_i"$) and the intra-field component ($intra0_j"$) of the j-th test point, the overall residual ($res_{i,j}$) equals $CD_{i,j}"$ minus $inter0_i"$ minus $intra0_j"$, which is $res_{i,j}=CD_{i,j}"-inter0_i"-intra0_j"$; S042: setting the inter-field component ($inter_{k,1}"$) of the k-th row and the l-th column on the wafer as $inter_{k,1}"=inter\_x_k"+inter\_y_1"+inter\_res_{k,1}"$, wherein, $inter\_x_k"$ is the inter-field X component between fields, $inter\_y_1$ is the inter-field Y component between fields, and $inter\_res_{k,1}"$ is the inter-field residual between fields; treating $inter\_x_k"$ and $inter\_y_1"$ as dummy variables of a inter-field X component set (inter_x) and a inter-field Y component set (inter_y) respectively, taking $inter\_x_k"$ and $inter\_y_1"$ as parameters without considering $inter\_res_{k,1}"$, and estimating parameters of inter" to obtain the inter-field X component ($inter\_x_k"$) and the inter-field Y component ($inter\_y_1"$) between fields, and the inter-field residual ($inter\_res_{k,1}"$) between fields equals $inter_{k,1}"$ minus $inter\_x_k"$ minus $inter\_y_1"$, which is $inter\_res_{k,1}"=inter_{k,1}"-inter\_x_k"-inter\_y_1"$; S043: setting the intra-field component ($intra_{m,n}"$) of the m-th row and the n-th column in the i-th field as $intra_{m,n}"=intra\_x_m"+intra\_y_n"+intra\_res_{m,n}"$, wherein, $intra\_x_m"$ is the intra-field X component of a field, $intra\_y_n"$ is the intra-field Y component of the field, and $intra\_res_{m,n}"$ is the intra-field residual of the field; treating $intra\_x_m$ and $intra\_y_n"$ as dummy variables of a intra-field X component set (intra_x) and a intra-field Y component set (intra_y) respectively, taking $intra\_x_m"$ and $intra\_y_n"$ as parameters without considering $intra\_res_{m,n}"$, and estimating parameters of intra" to obtain the intra-field X component ($intra\_x0_m"$) and the intra-field Y component ($intra\_y0_n"$) of the field, and the inter-field residual ($inter\_res_{k,1}"$) of the field equals $intra_{m,n}"$ minus $intra\_x_m"$ minus $intra\_y_n"$, which is $inter\_res_{k,1}"=intra_{m,n}"-intra\_x0_m"-intra\_y0_n"$; S044: repeating from step S041 to S043 until calculating the overall residual, the intra-field X components, the intra-field Y components, the intra-field residuals, the inter-field X components, the inter-field Y components, and the inter-field residuals of all the test points of all the fields in all the senses.

Further, the approach to the parameter estimation is maximum likelihood estimation.

The beneficial effects of the present invention are: the outer limit is used to estimate and remove extreme outliers from the critical dimension (CD) values by the outer limit, so as to reduce the spread of the extreme outliers, and less accurate critical dimension values are used to quickly analyze source of critical dimension errors; meanwhile, by multiple decompositions, reducing human interference, such as an artificial coordinate system and assumptions, based on the evaluation of the inter-field and intra-field components, rebuilt error of critical dimension is within 3 nanometers on the 90 nm technology node, thus the decomposition process of the present invention is stable.

BRIEF DESCRIPTION OF THE DRAWINGS

FIG. 1 is a frame diagram of critical dimension error analysis method of the present invention.

DETAILED DESCRIPTION

In order to make the objectives, technical solutions and advantages of the present invention clearer, the specific embodiments of the present invention will be further described in detail below in conjunction with the accompanying drawings.

It should be noted that in the following specific embodiments, in detailing the embodiments of the present invention, in order to clearly show the structure of the present invention for ease of explanation', the structure in the drawings is not drawn in accordance with the general scale, and carried out In order to partially enlarge, deform and simplify the process, it should be avoided as a limitation of the present invention.

A critical dimension error analysis method, comprising following steps:

S01: performing lithography processes on a quantity of wafers, wherein each of the wafers comprises fields and the number of the fields is M, the lithography processes are the same in each of the fields, setting the same number of test points in each of the fields and the number of the test points is N, measuring the critical dimension (CD) values of the test points in each of the fields respectively. A CD-SEM or a scatterometry equipment can be used to measure the CD values. In S01, the lithography process can be used to etch a specific pattern or only expose photo-resist. M and N are integers greater than 1.

S02: removing extreme outliers from the critical dimension (CD) values; specific steps can be as following:

S021: setting the critical dimension value ($CD_{i,j}$) of the j-th test point in the i-th field as $CD_{i,j}=inter_i+intra+Er_{i,j}$, wherein, $inter_i$ is the inter-field component of the j-th test point, $intra_j$ is the intra-field component of the j-th test point, and $Er_{i,j}$ is error; treating $inter_i$ and $intra_j$ as dummy variables of a inter-field component set (inter) and a intra-field component set (intra) respectively, taking $inter_i$ and $intra_j$ as parameters without considering $Er_{i,j}$, and estimating parameters of CD to obtain the inter-field component ($inter0_i$) and the intra-field component ($intra0_j$) of the j-th test point, and after reconstruction, the rebuilt critical dimension value (CD') of the j-th test point equals $inter0_i$ plus $intra0_j$, which is $CD'=inter0_i+intra0_j$. The specific parameter estimation can be maximum likelihood estimation, which is assumed that the error ($Er_{i,j}$) follows Gaussian distributed with expected values and variances of parameters ($inter_i$, $intra_j$). Assuming $inter_i$ and $intra_j$ are irrelevant, considered the variances are equal, the maximum likelihood estimation can be reduced to ordinary least squares.

S022: setting the relative error (Er_r') between CD' and CD as Er_r'=(CD'−CD)/CD', and calculating the outer limit of the relative error between CD' and CD; wherein, a calculation method for the outer limit comprises sorting the relative error between CD' and CD, and calculating a 25th quantile (Q1) and a 75th quantile (Q3), and setting IQR=Q3−Q1, the lower limit of the outer limit is Q1−3*IQR, and the upper limit of the outer limit is Q3+3*IQR. That is, in S022, the outer limit comprises the upper limit and the lower limit, and the critical dimension values located at the upper limit and the lower limit of the outer limit need to be removed.

S023: removing extreme outliers which exceed the outer limit of the relative error between CD' and CD;

S024: repeating from step S021 to S023 until the extreme outliers is removed, or ratio of number of remaining test points to number of original test points after removing is less than a number threshold, or number of iterations is greater than a iteration threshold. In S024, three iteration stop conditions are set, one is that the critical dimension values outside the outer limit is removed, and the other two are whether the critical dimension values outside the outer limit is removed or not, the ratio of the number of the remaining test points to the number of the original test points is required to less than the number threshold, or the number of the iterations (the number of times to repeat from step S021 to S023) is greater than the iteration threshold, that is, a removing process is automatically stopped. Wherein, the number threshold and the iteration threshold can be set based on empirical values, the two iteration stop conditions are set in S024 to prevent the removing process from entering an endless loop and to ensure the entire analysis process is carried out sequentially.

S03: rebuilding remaining CD values by a reconstruction model fitting method, and obtaining rebuilt critical dimension (CD") values, according to relative error between CD" and CD, dividing the rebuilt critical dimension (CD") values into scenes and the number of the scenes is A, and the the same test points in the fields are in the same scene, and the relative error between CD" and CD of any two fields in each of the scenes is non-periodic in spatial distribution; A is an integer greater than 0.

In S03, determining whether the relative error between CD" and CD of any two fields in each of the scenes is periodic in the spatial distribution by a Pearson coefficient; the Pearson coefficient can be calculated by the two fields, the closer the absolute value of the Pearson coefficient is to 1, the more similar the two fields are, and the closer to 0, the less similar the two fields are, the two fields are hoped to be not related to each other. While the Pearson coefficient of any two fields in one scene is less than the set threshold, then the relative error between CD" and CD of the two fields in the scene is non-periodic in the spatial distribution. In the present invention, the distribution of critical dimension error at the same position of each of exposure fields is 0 as expected distribution, it is regarded as no periodicity; otherwise, it is regarded as periodic, which indicates that the critical dimension error has not been decomposed completely, and some problems will be missed. In the present invention, under a set of reconstruction model parameters, when all the test points is satisfied that the relative error between CD" and CD of any two fields is non-periodic in the spatial distribution, that is, A=1, and the reconstruction model parameters is just needed to be recorded; when all the test points is not satisfied that the relative error between CD" and CD of any two fields is non-periodic in the spatial distribution, the test points are needed to be divided into the scenes and the number of the scenes is A, each of the scenes can correspond to different reconstruction model parameters, and the reconstruction model parameters corresponding to each of the scenes are recorded separately for obtaining the rebuilt critical dimension values (CD") after reconstruction. The reconstruction model in the present invention can specifically be a GBDT Model or an XGBoost model. It is worth noting that each of the critical dimension values in the present invention corresponds to a global coordinate, a inter-field coordinate and a intra-field coordinate of a critical dimension value, that is, the critical dimension value, the global coordinate, the inter-field coordinate and the intra-field coordinate of the critical dimension value form the data set of the test point, wherein, the combination of the intra-field coordinate and the inter-field coordinate is approximately equal to the global coordinate. The four items in the data set exist at the same time, when removing the extreme outliers, a critical dimension value exceed the outer limit is deleted, that is, the data set corresponding to the abnormal critical dimension value is deleted.

A specific parameter reconstruction process in S03 comprises following steps:

S031: inputting the global coordinates of the wafer as independent variables into the reconstruction model, and inputting the remaining critical dimension values as dependent variables into the reconstruction model, and reconstructing the critical dimension values by adjusting reconstruction model parameters to obtain the rebuilt critical dimension (CD") values after reconstruction;

S032: calculating the relative error (Er") between CD" and CD and Er"=(CD"−CD)/CD", and dividing the remaining critical dimension values into the scenes according to the relative error between CD" and CD, and the number of the scenes is A. The meaning of the scene in S032 is: when rebuilding a model by only one set of reconstruction model parameters, and the relative error between CD" and CD of any two fields in each of the scenes is non-periodic in the spatial distribution, dividing the data set into the scenes and the number of the scenes is A, fitting by groups of reconstructed model parameters and the number of the groups is A, thus each of fitting errors is non-periodic, that is, the groups of the reconstructed model parameters are regarded as reconstructed models and the number of the reconstructed models is A, which is corresponding to the scenes.

S033: recording the reconstruction model parameters corresponding to each of the scenes.

In S033, the critical dimensions are reconstructed, and the critical dimension values after reconstruction of the reconstruction model only retain low-frequency components. As shown in FIG. 1, high-frequency components are automatically filtered out. In S04, the low-frequency components are further decomposed into the intra-field components, the inter-field components and the overall residual. The overall residual is others shown in FIG. 1.

S04: calculating components and corresponding residuals of the test points in each of the scenes under a reference system corresponding to a correction model by the parameter estimation; wherein, the components and the corresponding residuals of the test points under the reference system corresponding to the correction model by the parameter estimation comprise the overall residual, intra-field X components, intra-field Y components, intra-field residuals, inter-field X components, inter-field Y components, and inter-field residuals of the test points. The calibration model refers to a model used for calibration in step S05. Any calibration model in the prior art can be used for calibration. Since the selected calibration model is different, components and corresponding residuals for a reference system corresponding to the selected calibration model is required in S04, wherein, the reference system comprise a inter-field coordinate system, a intra-field coordinate system and a Cartesian (rectangular) coordinate system, and the reference system can also comprise a polar coordinate system, etc.

Specifically, the Cartesian coordinates in the reference system can be replaced with a polar coordinate system, etc., or the inter-field coordinate system, the intra-field coordinate system, the Cartesian coordinate system and the polar coordinate system can be comprised in the reference system simultaneously. Since the test points are divided into the scenes and the number of the scenes is A in S03, analyzing the test points in each of the scenes in turn in S04, taking one of the scenes as an example to explain, calculation methods of other scenes are the same; a specific calculation method comprises:

S041: setting the critical dimension value ($CD_{i,j}''$) of the j-th test point in the i-th field as $CD_{i,j}''=\text{inter}_i''+\text{intra}_j''+\text{res}_{i,j}$, wherein, $\text{inter}_i''$ is the inter-field component of the j-th test point, $\text{intra}_j''$ is the intra-field component of the j-th test point, and $\text{res}_{i,j}$ is the overall residual; treating $\text{inter}_i''$ and $\text{intra}_j''$ as dummy variables of a inter-field component set (inter) and a intra-field component set (intra) respectively, taking $\text{inter}_i''$ and $\text{intra}_j''$ as parameters without considering $\text{res}_{i,j}$, and estimating parameters of $CD''$ to obtain the inter-field component ($\text{inter}0_i''$) and the intra-field component ($\text{intra}0_j''$) of the j-th test point, the overall residual ($\text{res}_{i,j}$) equals $CD_{i,j}''$ minus $\text{inter}0_j''$ minus $\text{intra}0_j''$, which is $\text{res}_{i,j}=CD_{i,j}''-\text{inter}0_i''-\text{intra}0_j''$. the approach to the parameter estimation is the maximum likelihood estimation, which is assumed that the overall residual ($\text{res}_{i,j}$) follows the Gaussian distributed with the expected values and the variances of parameters ($\text{inter}_i''$ and $\text{intra}_j''$). Assuming $\text{inter}_i''$ and $\text{intra}_j''$ are irrelevant, considered the variances are equal, the maximum likelihood estimation can be reduced to the ordinary least squares.

S042: setting the inter-field component ($\text{inter}_{k,1}''$) of the k-th row and the 1-th column on the wafer as $\text{inter}_{k,1}''=\text{inter}\_x_k''+\text{inter}\_y_1''+\text{inter}\_\text{res}_{k,1}''$, wherein, $\text{inter}\_x_k''$ is the inter-field X component between fields, $\text{inter}\_y_1$ is the inter-field Y component between fields, and $\text{inter}\_\text{res}_{k,1}''$ is the inter-field residual between fields; treating $\text{inter}\_x_k''$ and $\text{inter}\_y_1''$ as dummy variables of a inter-field X component set (inter_x) and a inter-field Y component set (inter_y) respectively, taking $\text{inter}\_x_k''$ and $\text{inter}\_y_1''$ as parameters without considering $\text{inter}\_\text{res}_{k,1}''$, and estimating parameters of $\text{inter}''$ to obtain the inter-field X component ($\text{inter}\_x0_k''$) and the inter-field Y component ($\text{inter}\_y0_1''$) between fields, and the inter-field residual ($\text{inter}\_\text{res}_{k,1}''$) between fields equals $\text{inter}\_\text{res}_{k,1}''$ minus $\text{inter}\_x0_k''$ minus $\text{inter}\_y0_1''$, which is $\text{inter}\_\text{res}_{k,1}''=\text{inter}_{k,1}''-\text{inter}\_x0_k''-\text{inter}\_y0_1''$. The approach to the parameter estimation is the maximum likelihood estimation, which is assumed that the overall residual ($\text{inter}\_\text{res}_{k,1}''$) follows the Gaussian distributed with the expected values and the variances of parameters ($\text{inter}\_x_k''$ and $\text{inter}\_y_1$). Assuming $\text{inter}\_x_k''$ and $\text{inter}\_y_1''$ are irrelevant, considered the variances are equal, the maximum likelihood estimation can be reduced to the ordinary least squares.

S043: setting the intra-field component ($\text{intra}_{m,n}''$) of the m-th row and the n-th column in the i-th field as $\text{intra}_{m,n}''=\text{intra}\_x_m''+\text{intra}\_y_n''+\text{intra}\_\text{res}_{m,n}''$, wherein, $\text{intra}\_x_m''$ is the intra-field X component of the field, $\text{intra}\_y_n''$ is the intra-field Y component of the field, and $\text{intra}\_\text{res}_{m,n}''$ is the intra-field residual of the field; treating $\text{intra}\_x_m$ and $\text{intra}\_y_n''$ as dummy variables of a intra-field X component set (intra_x) and a intra-field Y component set (intra_y) respectively, taking $\text{intra}\_x_m''$ and $\text{intra}\_y_n''$ as parameters without considering $\text{intra}\_\text{res}_{m,n}''$, and estimating parameters of $\text{intra}''$ to obtain the intra-field X component ($\text{intra}\_x0_m''$) and the intra-field Y component ($\text{intra}\_y0_n''$) of the field, and the inter-field residual ($\text{inter}\_\text{res}_{k,1}''$) of the field equals $\text{intra}_{m,n}''$ minus $\text{intra}\_x0_m''$ minus $\text{intra}\_y0_n''$, which is $\text{inter}\_\text{res}_{k,1}''=\text{intra}_{m,n}''-\text{intra}\_x0_m''-\text{intra}\_y0_n''$. the approach to the parameter estimation is the maximum likelihood estimation, which is assumed that the overall residual ($\text{intra}_{m,n}''$) follows the Gaussian distributed with the expected values and the variances of the parameters ($\text{intra}\_x_m''$ and $\text{intra}\_y_n''$). Assuming $\text{intra}\_x_m''$ and $\text{intra}\_y_n''$ are irrelevant, considered the variances are equal, the maximum likelihood estimation can be reduced to the ordinary least squares.

S044: repeating from step S041 to S043 until calculating the overall residual, the intra-field X components, the intra-field Y components, the intra-field residuals, the inter-field X components, the inter-field Y components, and the inter-field residuals of all the test points of all the fields in all the senses.

In the present invention, the critical dimensions are reconstructed in S03, and the critical dimension values after reconstruction of the reconstruction model only retain low-frequency components. the low-frequency components are decomposed into the intra-field components, the inter-field components the overall residual by least squares, and then the intra-field components are decomposed into the intra-field X components, the intra-field Y components and the intra-field residuals; the inter-field components are decomposed into the inter-field X components, the inter-field Y components and the inter-field residuals.

S05: according to the overall residual, the intra-field X components, the intra-field Y components, the intra-field residuals, the inter-field X components, the inter-field Y components, and the inter-field residuals of all the test points calculated above, modifying machine parameters and masks by the correction model, so as to reduce the instability of the critical dimensions. Overall residuals of multiple wafers are compared and observed in the present invention, which can be used to estimate whether there are wafer abnormalities on the wafers that are not presented in units of fields globally, inter-field residuals of a wafer exposed by FEM (Focus Depth Energy Matrix) can be used to estimate the trend change of the local area of the wafer, an abrupt point appearing on the intra-field residuals can be used to estimate anomalies existing in a field unit such as masks and lens; the inter-field components can be used as a basis for adjusting machine parameters.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning. Within the protection scope of the appended claims of the present invention.

What is claimed is:

1. A critical dimension error analysis method, comprising:
   S01: performing lithography processes on a wafer, wherein the wafer comprises fields and the number of the fields is M, the lithography processes are the same in each of the fields, setting the same number of test points in each of the fields and the number of the test points is N, measuring the critical dimension (CD) values of the test points in each of the fields respectively; M and N are integers greater than 1;
   S02: removing extreme outliers from the critical dimension (CD) values;
   S03: rebuilding remaining CD values by a reconstruction model fitting method, and obtaining rebuilt critical dimension (CD'') values, according to relative error between CD" and CD, dividing the rebuilt critical dimension (CD") values into scenes and the number of the scenes is A, and the same test points in the fields are in the same scene, and the relative error between CD" and CD of any two fields in each of the scenes is non-periodic in spatial distribution; A is an integer greater than 0;

S04: calculating components and corresponding residuals of the test points in each of the scenes under a reference system corresponding to a correction model by parameter estimation;

S05: modifying machine parameters and masks by the correction model according to above calculation results.

2. The method of claim 1, wherein in step S02, removing the extreme outliers by the parameter estimation, which comprises:

S021: setting the critical dimension value ($CD_{i,j}$) of the j-th test point in the i-th field as $CD_{ij}=inter_i+intra_j+Er_{i,j}$, wherein, $inter_i$ is an inter-field component of the j-th test point, $intra_j$ is an intra-field component of the j-th test point, and $Er_{i,j}$ is error; treating $inter_i$ and $intra_j$ as dummy variables of an inter-field component set (inter) and an intra-field component set (intra) respectively, taking $inter_i$ and $intra_j$ as parameters without considering $Er_{i,j}$, and estimating parameters of CD to obtain the inter-field component ($inter0_i$) and the intra-field component ($intra0_j$) of the j-th test point, and after reconstruction, the rebuilt critical dimension value (CD') of the j-th test point equals $inter0_i$ plus $intra0_j$, which is $CD'=inter0_i+intra0_j$;

S022: setting the relative error (Er_r') between CD' and CD as Er_r'=(CD'-CD)/CD', and calculating an outer limit of the relative error between CD' and CD;

S023: removing extreme outliers which exceed the outer limit of the relative error between CD' and CD;

S024: repeating from step S021 to S023 until the extreme outliers is removed, or ratio of number of remaining test points to number of original test points is less than a number threshold after removing, or number of iterations is greater than a iteration threshold.

3. The method of claim 2, wherein in step S023, a calculation method for the outer limit comprises sorting the relative error between CD' and CD, and calculating a 25th quantile (Q1) and a 75th quantile (Q3), and setting IQR=Q3-Q1, a lower limit of the outer limit is Q1-3*IQR, and an upper limit of the outer limit is Q3+3*IQR.

4. The method of claim 2, wherein the approach to the parameter estimation is maximum likelihood estimation.

5. The method of claim 1, wherein step S03 comprises:

S031: inputting a global coordinates of the wafer as independent variables into the reconstruction model, and inputting the remaining critical dimension values as dependent variables into the reconstruction model, and reconstructing the critical dimension values by adjusting reconstruction model parameters to obtain the rebuilt critical dimension (CD") values after reconstruction;

S032: calculating the relative error (Er") between CD" and CD and Er "=(CD"-CD)/CD", and dividing the remaining critical dimension values into the scenes according to the relative error between CD" and CD, and the number of the scenes is A;

S033: recording the reconstruction model parameters corresponding to each of the scenes.

6. The method of claim 5, wherein the reconstruction model is a Gradient Boosting Decision Tree (GBDT) model or an Extreme Gradient Boosting (XGBoost) model.

7. The method of claim 1, wherein in S03, determining whether the relative error between CD" and CD of any two fields in each of the scenes is periodic in the spatial distribution by a Pearson coefficient; while the Pearson coefficient of any two fields in one scene is less than a set threshold, then the relative error between CD" and CD of the two fields in the scene is non-periodic in the spatial distribution.

8. The method of claim 1, wherein in S04, the components and the corresponding residuals of the test points under the reference system corresponding to the correction model comprise an overall residual, intra-field X components, intra-field Y components, intra-field residuals, inter-field X components, inter-field Y components, and inter-field residuals of the test points.

9. The method of claim 8, wherein in S04 comprises:

S041: setting the critical dimension value ($CD_{i,j}$") of the j-th test point in the i-th field as $CD_{i,j}"=inter_i"+intra_j"+res_{i,j}$, wherein, $inter_i"$ is the inter-field component of the j-th test point, $intra_j"$ is the intra-field component of the j-th test point, and $res_{i,j}$ is the overall residual; treating $inter_i"$ and $intra_j"$ as dummy variables of an inter-field component set (inter) and an intra-field component set (intra) respectively, taking $inter_i"$ and $intra_j"$ as parameters without considering $res_{i,j}$, and estimating parameters of CD" to obtain the inter-field component ($inter0_i"$) and the intra-field component ($intra0_j"$) of the j-th test point, the overall residual ($res_{i,j}$) equals $CD_{i,j}"$ minus $inter0_i"$ minus $intra0_j$ ", which is $res_{i,j}\ CD_{i,j}"$ -inter0; "-intraOj" ;

S042: setting the inter-field component ($inter_{k,1}$") of the k-th row and the 1-th column on the wafer as $inter_{k,1}"=inter\_x_k"+inter\_y_1"+inter\_res_{k,1}"$, wherein, $inter\_x_k"$ is the inter-field X component between fields, $inter\_y_1$ is the inter-field Y component between fields, and inter $res_{k,1}"$ is the inter-field residual between fields; treating $inter\_x_k"$ and $inter\_y_1"$ as dummy variables of an inter-field X component set (inter_x) and an inter-field Y component set (inter y) respectively, taking $inter\_x_k"$ and $inter\ y_1"$ as parameters without considering $inter\_res_{k,1}"$, and estimating parameters of inter $x_k"$ and inter $y_1"$ to obtain the inter-field X component ($inter\_x0_k"$) and the inter-field Y component ($inter\_y0_1"$) between fields, and the inter-field residual ($inter\_res_{k,1}"$) between fields equals $inter_{k,1}"$ minus $inter\_x0_k"$ minus $inter\_y0_1"$, which is $inter\_res_{k,1}"=inter_{k,1}"-inter\_x0_k"-inter\_y0_1"$;

S043: setting the intra-field component ($intra_{m,n}"$) of the m-th row and the n-th column in the i-th field as $intra_{m,n}"=intra\_x_m"+intra\_y_n"+intra\_res_{m,n}"$, wherein, $intra\_x_m"$ is the intra-field X component of the j-th test point, $intra\_y_n"$ is the intra-field Y component of the field, and $intra\_res_{m,n}"$ is the intra-field residual of the field; treating $intra\_x_m"$ and $intra\_y_n"$ as dummy variables of an intra-field X component set (intra_x) and an intra-field Y component set (intra_y) respectively, taking $intra\_x_m"$ and $intra\_y_n"$ as parameters without considering $intra\_res_{m,n}"$, and estimating parameters of intra $x_m"$ and intra $y_n"$ to obtain the intra-field X component ($intra\_x0_m"$) and the intra-field Y component ($intra\_y0_n"$) of the field, and the inter-field residual ($inter\_res_{k,1}"$) of the field equals $intra_{m,n}"$ minus $intra\_x0_m"$ minus $intra\_y0_n$ ", which is inter $res_{k,1}"=intra_{m,n}"-intra\_x0_m"-intra\_y0_n"$;

S044: repeating from step S041 to S043 until calculating the overall residual, the intra-field X components, the intra-field Y components, the intra-field residuals, the inter-field X components, the inter-field Y components, and the inter-field residuals of all the test points of all the fields in all the senses.

10. The method of claim 9, the approach to the parameter estimation is maximum likelihood estimation.

* * * * *